United States Patent [19]

Gold

[11] 4,388,389

[45] Jun. 14, 1983

[54] PHOTO RESIST SPECTRAL MATCHING TECHNIQUE

[76] Inventor: Nathan Gold, Saratoga, Calif.

[21] Appl. No.: 321,656

[22] Filed: Nov. 16, 1981

[51] Int. Cl.$^3$ .................... G03C 5/04; G01N 21/00
[52] U.S. Cl. .................................... 430/30; 430/269; 430/494; 73/150 R; 356/404; 356/443
[58] Field of Search ............ 73/150 R; 356/443, 444, 356/404, 213; 355/38; 430/30, 296, 396, 494; 354/127, 128, 132

[56] References Cited

U.S. PATENT DOCUMENTS 4,097,876 6/1978 Uno et al. ............................ 354/31

Primary Examiner—John E. Kittle
Assistant Examiner—Jose G. Dees
Attorney, Agent, or Firm—Townsend and Townsend

[57] ABSTRACT

A high pressure mercury arc lamp such as the light source in a projection aligner is utilized in a photo resist calibrating process. The light source is utilized with narrow band interference filters centered on the mercury emission lines to isolate exposures to one narrow band of wave length at a time. The assumption is made (incorrectly) that the energy in each band of wave lengths from the high pressure mercury arc lamp is equal. Exposure to a narrow strip of photo resist—preferably in the form of a bar graph—on a semi-conductor wafer is made. A single wave length band is exposed for each bar of the graph. As each bar of the graph is scanned, exposure is varied in known ways (eg. linearly variable neutral density filters, changing apertures size, and/or varying exposure from changing wafer motion). The wafer is then developed and examined to determine the ratio of sensitivity for each wave length. A light meter is then placed in and exposed to the same high pressure mercury arc lamp. The meter is tailored to the same ratio of selectivity that was measured on the photo resist coated wafer. A surprising result is present in that the unknown energy distribution of the lamp results in the light meter being set to a measured spectral sensitivity for the photo resist. The meter accurately matches the photo resist and thereafter may be used with any number of spectrally variable light sources to accurately calibrate the same photo resist.

12 Claims, 6 Drawing Figures

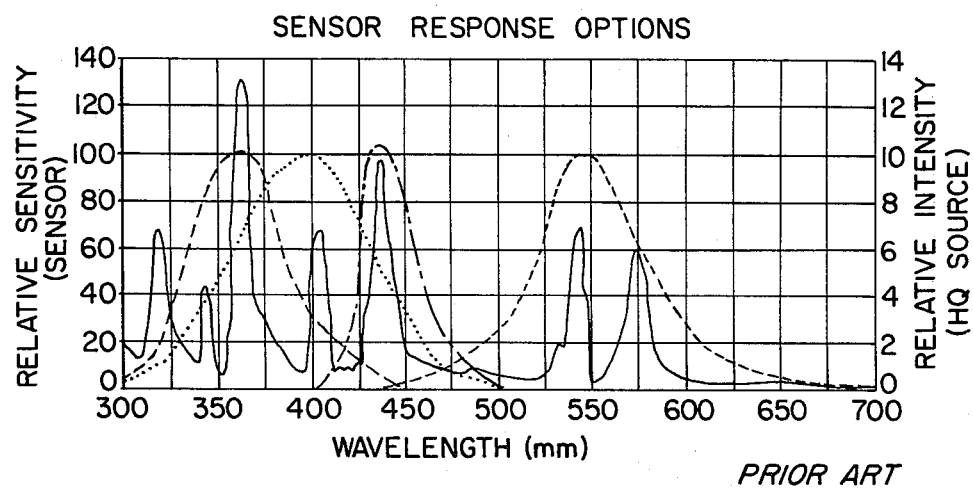
FIG.__1.   PRIOR ART
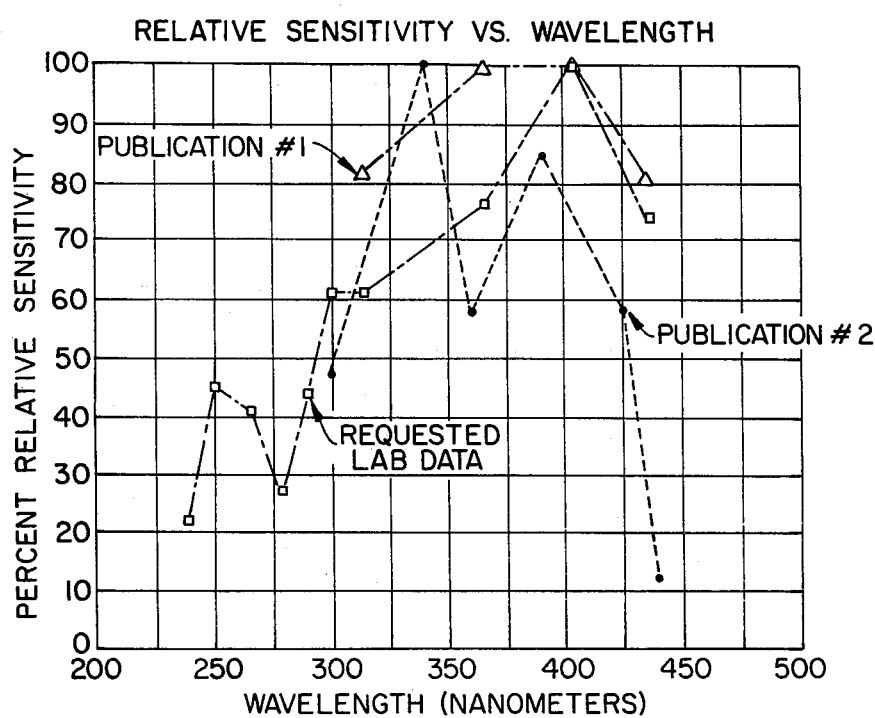
FIG.__2.   PRIOR ART

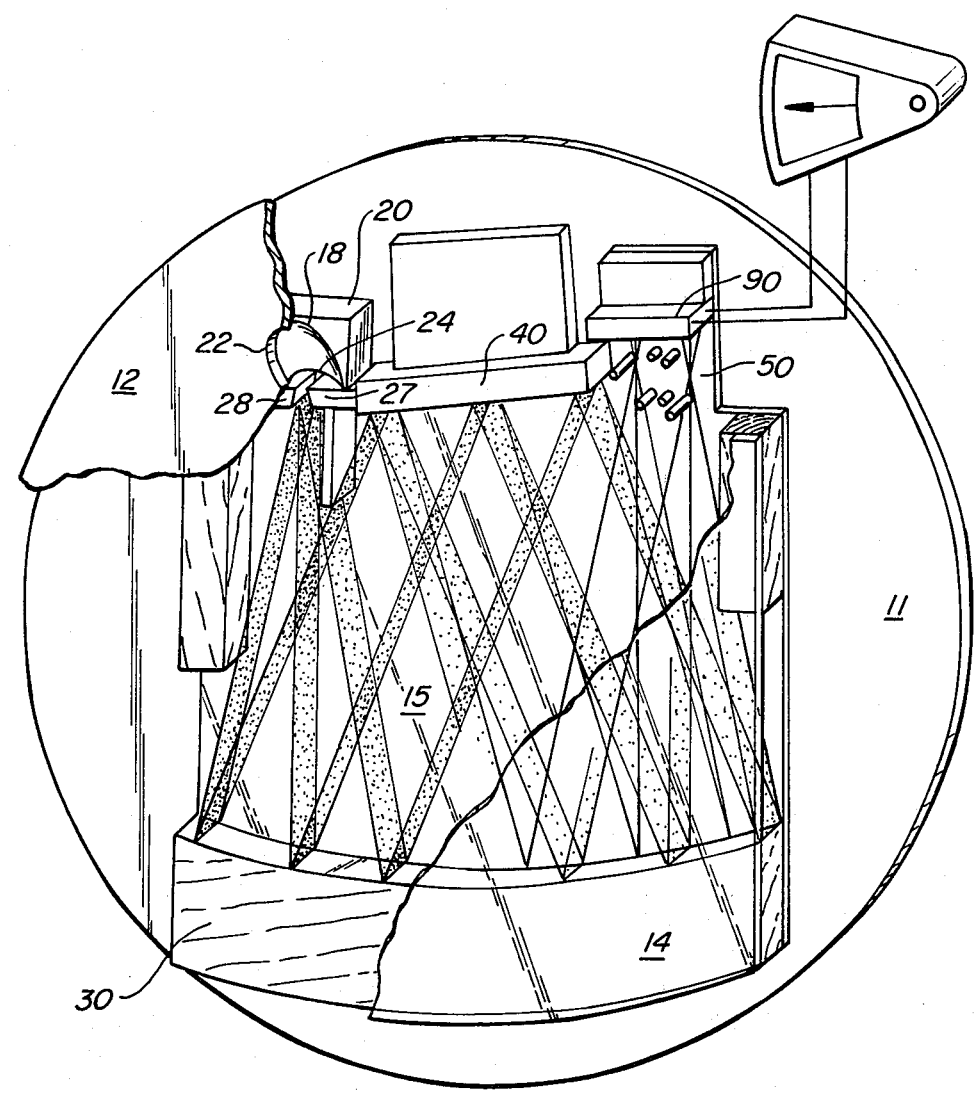
FIG._3.

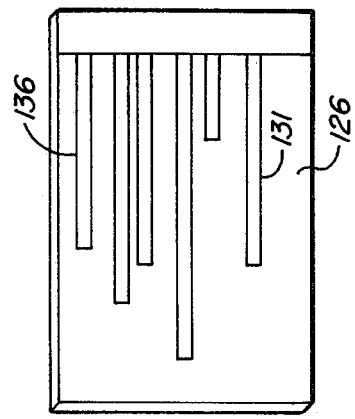
FIG._4B.
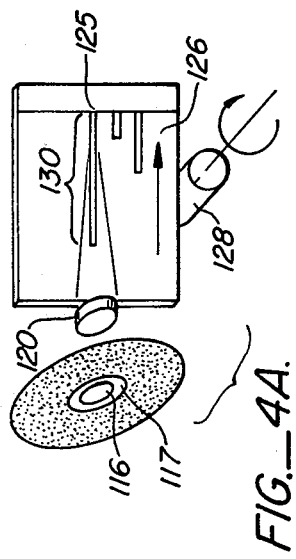
FIG._4A.
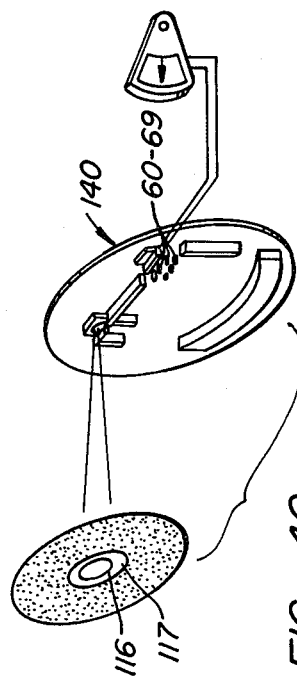
FIG._4C.
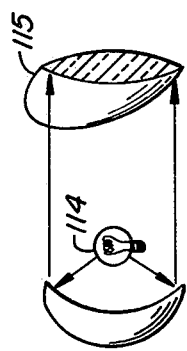
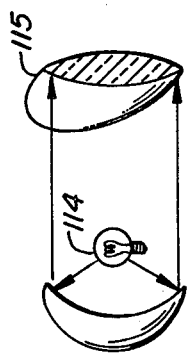

PHOTO RESIST SPECTRAL MATCHING TECHNIQUE

This invention relates to the measuring of the impact of exposure sources on photo resist. Specifically a method of determining accurately the exposure time on photo resist is disclosed.

SUMMARY OF THE PRIOR ART

The exposure equation for photo resist comprises the superimposition of two irregularities. The first irregularity is the irregularity of the light source. The second irregularity is the spectral dependency of the photo resist.

Referring to FIG. 1, a graphic representation of a mercury arc emission curve is illustrated. The reader will note that this curve is distinctly spiked with respective maxima appearing approximately at respective frequencies of 295.0 nanometers; 335.0 nanometers; 365.0 nanometers; 404.0 nanometers, 435.0 nanometers, 540.0 nanometers and 575.0 nanometers.

The problem of determining the spectral characteristics of mercury emission sources becomes even more complex when one considers that the respective curves as shown all dynamically vary with light source, age and even from light source to light source. Specifically, and with age, mercury pressure lamps undergo devitrification. Such devitrification varies the opaqueness of the contained light source, attenuating on a non-uniform basis the maxima of the mercury arc emission curve. In short some of the chromatic spikes grow, others shrink and all of these variations can and do occur dynamically. For example, the maxima shown at 404.0 nanometers could increase in intensity while that maxim at 365.0 nanometers could decrease in intensity, these respective changes all occurring with variable intensity over a period of time.

The second part of the exposure equation is even more uncertain. Specifically, manufacturers of photo resist produce photo resist with varying reported sensitivities. Accurate measurement of the response of photo resist is difficult. For example, and referring to FIG. 2, chromatic response curves are plotted for a photo resist sold by the Eastman Kodak Co. of Rochester N.Y. under the trademark of MPR 809. The representative curves are all for the same photo resist, one such curve being experimentally determined in a laboratory, a second being obtained from a first publication and the third curve from a second publication. Not only do the curves vary widely in their range, but additionally the photo sensitivity seems to vary from batch to batch.

This measurement of the spectral response in photo resist has heretofore be extremely difficult. First, lamps having evenly distributed ultra violet spectra are not obtainable at high intensity. While deuterium lamps do have an evenly distributed ultra violet spectra, such lamps are expensive and more importantly of low intensity. Thus the film must be exposed to light of vary low intensity in order to measure its spectral response with such deuterium lamps.

This low intensity exposure is compounded by the non-linearity of the film exposure commonly known under the title of "reciprocity failure". In reciprocity failure film exposes with great non-linearity below certain light thresholds. By way of example, where the amount of light impinging upon film is halved, the photo sensitivity to that light may be decrease by factors as much as eight times. Thus attempts to measure accurately the spectral response of photo resist using deuterium lamps have heretofore been relatively unsatisfactory. At the same time measuring spectral response utilizing high intensity light sources has failed because of the spike spectral response of such lamps as well as the dynamic variations with time of the maxima of such spectra one with respect to another.

The total exposure equation of a typical photo resist is the sum over all the frequencies of the discrete products at each frequency of the exposure source times the photo sensitivity of the photo resist at the same frequency. It has been found that by relying on a discrete frequency to give an indication of overall exposure only inaccuracy results. This may be seen from the graphs of FIGS. 1 and 2.

Referring to FIG. 1, the various filters are shown placed over the mercury arc emission curve. Specifically, it can be seen that the disclosed bell shaped curves clips some spikes and only partially encompass others. Where the height of the respective spikes are varying one with respect to another (as in devitrification of the light sources) inaccuracy compounds itself. Specifically by measuring the photo response at one discrete frequency you may or may not coincide with the desired exposure sumation required for all the discrete frequencies together. More often than not these variations lead to a trial and error of the photo resist process.

Trial and error on any kind of photo resist can be an expensive diversion. Typically, a single coating of a complicated circuit chip can include the placement of a silicon base, baking the base in an oxygen oven, coating the produced silicon oxide with photo resist, spinning the chip for a uniform coating, exposure of chip to a UV pattern, developing the chip, and defusing out any impurities. Remembering that the foregoing sequence can be repeated up to 10 times, the expense of the loss of a group of particularly completed chips containing complex circuits through improper exposure adjustment can be realized. Moreover, it will be remembered that line migration due to improper exposure setting changes resistance and capacitance values. Additionally line migration can and does short circuits. The importance of accurate exposure the first time projection occurs can not be over emphasized.

SUMMARY OF THE INVENTION

A high pressure mercury arc lamp such as the light source in a projection aligner is utilized in a photo resist calibrating process. The light source is utilized with narrow band interference filters centered on the mercury emission lines to isolate exposures to one narrow band of wave length at a time. The assumption is made (incorrectly) that the energy in each band of wave lengths from the high pressure mercury arc lamp is equal. Exposure to a narrow strip of photo resist—preferably in the form of a bar graph—on a semi-conductor wafer is made. A single wave length band is exposed for each bar of the graph. As each bar of the graph is scanned, exposure is varied in known ways (e.g. linearly variable neutral density filters, changing apertures size, and/or varying exposure from changing wafer motion). The wafer is then developed and examined to determine the ratio of sensitivity for each wave length. A light meter is then placed in and exposed to the same high pressure mercury arc lamp. The meter is tailored to the same ratio of selectivity that was measured on the photo resist coated wafer. A surprising result is present in that the unknown energy distribution of the lamp results in the light meter being set to a measured spectral sensitivity for the photo resist. The meter accurately matches the photo resist and thereafter may be used with any number of spectrally variable light sources to accurately calibrate the same photo resist.

OTHER OBJECTS, FEATURES AND ADVANTAGES OF THIS INVENTION

An object of this invention is to disclose a technique for matching light meter response to the photo response of photo resist, all without directly measuring the response of the light meter. According to this aspect of the invention, the photo resist coating to be sampled is scanned monochromatically at varying wave lengths to produce bar graph exposures. Typically, the wave lengths are selected by discrete interference filters, preferably coincident with the suspected or actual spikes of a high pressure mercury vapor source. Thereafter, a light meter capable of being spectrally tailored is inserted in and to the same light source utilized to form the bar graph. The same interference filters are used on the light meter, passing one frequency band at a time. Adjustment of each chromatic output is made on a proportionate basis to emulate the proportionality of the bar graph. This adjustment on a proportionate basis has the unexpected result of cancelling out the variations of the light source. There results a light meter tuned to the spectral response of the photo resist.

An advantage of this aspect of the invention is that the spectral response of the photo resist never has to be measured. Uncertainties of measurement either within the lab of the semi-conductor manufacturer or alternatively within the specifications of the photo resist manufacturer never need be contended with.

A further advantage of the disclosed process is that the non-uniformities of the light source effectively cancel each other out. Consequently, once total adjustment is made of a light meter using a photo resist, the fact that the light meter is moved from light source to light source no longer makes any difference. In fact, by cancelling out the non-uniformities of the light source, final adjustment of the light meter is peculiar to a batch of photo resist. Consequently, so long as the photo resist remains unchanged, the calibration the light meter can likewise remain unchanged.

Other objects, features and advantages of this invention will become more apparent after referring to the following specifications and attached drawings in which:

FIG. 1 is a prior art representation of the mercury arc emission curve illustrating the optical cutoff of various filters and showing graphically the inadequacy of trying to determine total output utilizing one filter in the path of a photometer;

FIG. 2 is a curve similar to FIG. 1 illustrating the spectral response of a single brand of photo resist as experimentally determined in a laboratory and reported in two discrete publications;

FIG. 3 is a perspective view of a light meter which can be spectrally tailored in accordance with the teachings of this invention; and, FIGS. 4A–4C are a cartoon series illustrating the discrete steps of the process hereof.

The process of this invention can be best understood by referring to FIG. 4A. A mercury light source 114 is schematically illustrated passing through condensing optics 115 to an aperture 116 having a filter of discrete frequency 117 covering the aperture. Light from the aperture thereafter passes through optics for varying the intensity of the resultant beam. Optics 120 trace the beam 125 on a sheet of photo resist 126. Typically, the sheet 126 is driven past the produced beam on a moving film by wheel 128.

As illustrated in FIG. 4A, each time a bar graph is generated a filter 117 is placed in the illustrated apparatus. Discrete filters for each of the frequencies of the spectral spikes illustrated in FIG. 1 are utilized. For example, the frequencies used can include the following nanometric wave lengths 253.7; 295.0; 335.0; 365.0; 404.7; and, 435.7.

Taking a total of six such bar graphs and referring to the exemplary graphs 130 on FIG. 4A, it will be seen that the graphs have differing heights with respect to one another. Indeed one can readily determine the ratio of intensities at one frequency with respect to the remaining frequencies by merely measuring the height of the resultant bar graph.

Once the bar graph is determined, the photo resist will have the configuration shown in FIG. 4B. It will be seen that the distinctive bars 131 through 136 are all traced on the photo resist 126.

Referring to FIG. 4C, it can be seen that light source 114 is again passed through aperture 116 with the same or substantially identical discrete filters 117 adding the particular chromatic frequencies desired. As each frequency is passed through filter 117 the resultant light impinges upon a light meter 140. Light meter 140 is thereafter spectrally adjusted by adjustment screws 61 to 69 to spectrally tailor the response of the meter at a gauge G. The construction of such a light meter can be readily understood by referring to FIG. 3 of the disclosed invention.

Referring to FIG. 3 the light meter of my invention is illustrated sandwiched between two mirrors 14, 15. The covers 11, 12 define an aperture 22 and has communicated thereto a conical reflecting chamber 18 defined within a body 20 of relatively high reflectively. It can be seen that the function of the cone 18 is to deflect incoming light at right angles into slit 24.

Communicated to one side of chamber 18 is a slit 24. Slit 24 emits diverging light rays to a cylindrical mirror 30. Light from slit 24 upon impacting mirror 30 and retro reflected therefrom rebound in collimation to diffraction grating 40.

At the diffraction grating, dependent upon both the tipping of the grating as well as the spacial separation of the ruling, chromatic classification occurs with reflection to the cylindrical mirror 30. Mirror 30 in turn causes focus of the discrete spectral bands at the focal plane 50. The discrete frequencies come to focus at discrete lines. Thereafter, light impinges upon a photo sensitive surface 90 and is read by conventional photo sensitive surfaces connected to meters. In the embodiment illustrated in FIG. 1, the photo sensitive surface 90 in effect integrates the total light received. It is directly connected to an output meter to give the light intensity reading desired.

Specifics can be given of a typical light meter. Specifically, the cylindrical mirror is at least 2.5 inches in length. It is designed to have a 4 inch radius of curvature.

An axis generated at the sagitta of the 2.5 inch segment of the mirror is convenient for the description. An entrance slit 24 is ¾ inch off of this axis and aligned parallel thereto.

Diffraction grating 40 includes six hundred rulings per millimeter. Typically, the grating is tipped at an angle of 5.71 degrees in the direction of entrance slit 24.

The 4 inch radius of curvature mirror in effect produces a focal plane 50. The discrete frequencies specifically attenuated in the spectral tuning of the light meters can be enumerated (illustrated with respect to FIG. 3).

In the ultra violet range common in the semi-conductor industry, discrete nanometric bands are of interest as typically coincident to peaks or spikes in the spectral output of mercury (Hg) high pressure lamps. Specifically, the following nanometric ranges are of specific interest: 253.7; 295.0; 335.0; 365.0; 404.7; 435.7 all of the above to plus or minus 2 nanometers.

The reader will understand that the modification here of the Ebert monochronmater is to fabricate Ebert type optics to a spectrograph. Unlike a spectrograph, weight summing of the discrete spectral bands must occur. A mechanical scheme for producing such weighted summing is shown in FIG. 3.

Referring to FIG. 3, the placement of the mechanical apertures stops of this invention is illustrated. Specifically, they take the form of threaded screws passing from the back surface of glass plate 15 and intruding into the interstitial area between the confronting reflective surfaces on mirror pieces 14, 15.

In the following description, the "near side" location of the mechanical stops will be referred to as that side to and towards the cylindrical mirror from focal plane 50. The "far side" will be referred to as that side of focal plane 50 which is away from the cylindrical mirror.

A first shutter stop 60 is disclosed on the near side of focal plane 50. Typically, it comprises a threaded bolt in a preselected diameter, the diameter being directly dependent upon its spacing from the focal plane 50. Typically it is placed on the near side of the focal plane 50 so that all converging rays of the 435.7 nanometer band are obscured. Thus upon adjustment of the screw into and out of the plane of mirror 15 interference with the 435.7 nanometer band will occur.

Likewise and on the far side of plane 50 there is placed a second shutter stop 62. Shutter stop 62 interferes with all diverging rays of the 404.7 nanometer band.

Similar aperture stops 64 for 365.0 nanometers, 66 for 335.0 nanometers, 68 for 295.0 nanometers and 69 for 253.7 nanometers are utilized. In each case they are placed on alternating sides far and near of the focal plane 50 to interfere physically with either the converging or diverging rays.

It is important to note that the disclosed filter elements do not overlap or interfere one with another mechanically. This is accomplished by the disclosed spacing out of the focal plane 50. Moreover, and as light passes through to the photo diode 90, an integration of the total light passed at each of the band widths will occur. This integration will emulate the exposure properties of the photo resist to which the light meter is tuned.

The reader will realize that the mechanical shuttering scheme herein illustrated with respect to FIG. 3 can be substituted with electronic shuttering schemes. Like the previous scheme, a system of weighted averaging is utilized to give the desired output.

It will be understood that the forgoing description is sufficient to practice this invention. However, and out of an abundance of caution, applicant hereby incorporates by reference that application filed of even date herewith entitled "Spectrally Tailored Wafer Chuck Shaped Light Meter", filed as patent application Ser. No. 321,657.

FIG. 3 of this application is identical to FIG. 1 of the incorporated by reference application.

SUMMARY OF INVENTION

The Summary of Invention is as follows:

An Ebert monochromator is modified in a wafer chuck format and adapted to receive and sum spectrally tailored light in discrete band widths so that the meter emulates the photographic response of photo resist to light from a high pressure mercury lamp. The monochromator light path is placed between the two closely spaced parallel mirrors (spaced apart on the order of ⅛ of an inch). The apparatus includes a circular entrance aperture having a right angle deflecting cone directed to a slit. That slit thereafter emits light to a cylindrical mirror. At the cylindrical mirror, collimated light rebounds to and on a diffraction grating. The light is chromatically classified at the diffraction grating, rebounds to the cylindrical mirror and on reflection passes to a focussing plane. At the focussing plane the particular spectra detected is displayed. Two apparatus are disclosed for tuning the spectral response of the light meter to the spectral response of the photo resist. In one embodiment moveable shutter elements at preselected intervals on either side of the focussing plane in an alternating pattern are located. These moveable shutter elements penetrate into and out of the interstitial area between the parallel mirrors. These moveable shutters—typically in the form of screws—allow light at discrete spectral lines to be tailored in passage through the light meter. By placing a photo sensor downstream of the apertures and focal plane, the flow of light through the light meter is integrated and as spectrally tailored closely parallels the response of the photo resist. According to a second and preferred embodiment, a photo diode array is placed at the focussing plane of the monochromator. The diodes are discretely tuned in their response to emulate the response of the photo resist. The output of the light meter in sum emulates the exposure characteristics of the photo resist. Both embodiments of the disclosed light meter are particularly suited to placement in the printing optics of the semiconductor industries, such as the placement in and to alignment projectors for the making of semi-conductor chips.

A typical claim of the incorporated by reference application is as follows:

1. A light meter comprising in combination: a spectrograph for receiving and classifying a multi-chromatic light source into discrete chromatic bands at a focal plane; at least one photo sensitive element disposed proximate to said focal plane for receiving light thereon from at least a plurality of said bands; and means for producing at said photo sensitive element weighted summing of each of the spectrally produced bands.

The reader will recall that I have referred to the "surprising result" of being able to set the light meter to the photo sensitivity of the photo resist without ever directly measuring the spectral response to the photo resist at the ultra violet range used. I have found that the process herein outlined is operable. I offer the following explanation to assist those in the art.

The unknown energy distribution of the lamp resulted in a measured spectral sensitivity for the photo resist. This photo sensitivity is not accurate. However, calibrating the spectrally tuned meter in the same apparatus result in the cancellation of the error due to the unknown energy distribution of the lamp. The result is that the spectrally tuned photo meter accurately matches the spectral response of the photo resist, even though the actual photo resist sensitivity curve remains unknown throughout the process thus an "omitted step" is present.

An example may assist. Assume that the method shows the photo resist to have a sensitivity at 365.0 nanometers that is twice the sensitivity at 405.0 nanometers. The meter is calibrated in the same apparatus to give a reading at 365.0 nanometers that is double the reading at 405.0 nanometers. Supposed the output of the light source at 365.0 nanometers is only 25% of the output of the light source at 405.0 nanometers, instead of being equal. When we measure the sensitivity of the photo resist at 365.0 nanometers as twice the sensitivity as at 405.0 nanometers, it was really eight times as sensitive. The error of the light source is cancelled; the setting of the meter accurately measures the photo resist.

What is claimed is:

1. A method of measuring the response of photo resist to a high pressure mercury arc lamp comprising the steps of: providing a high pressure mercury arc lamp; utilizing discrete frequency bands from said high pressure mercury arc lamp to expose at the focus of said mercury arc lamp said photo resist, the exposure varying at a constant rate for each band to generate bar graphs; measuring the variable bar graphs to determine their ratio of exposure one to another; placing a light meter at the focus of the apparatus; and for each discrete frequency calibrating said light meter to emit signal in a weighted average proportional to said ratios whereby said light meter is tuned to the spectral response of said photo resist.

2. The invention of claim 1 and comprising the additional steps of changing said light source through a second high pressure mercury arc lamp and using said light meter to measure the output of said light source for exposure of the same photo resist on said second light source.

3. A method of measuring the response of photo resist to any high pressure mercury arc lamp comprising the steps of; providing a first high pressure mercury arc lamp; utilizing discrete frequency bands from said high pressure mercury arc lamp to expose at the focus of said mercury arc lamps said photo resist; varying the exposure of said photo resist at a constant rate; measuring the proportionality of exposure of said photo resist to determine the ratio of an exposure to the remaining exposure of said photo resist; placing a light meter at the focus of said apparatus having means for being discretely tuned at preselected frequencies; calibrating said light meter for each discrete frequency in a weighted average proportional to the ratios of exposure of said photo resist whereby said light meter is tuned to the spectral response of said photo resist.

4. The invention of claim 3 and wherein said exposure of said photo resist includes the step of passing photo resist at a constant velocity and varying the exposure of said photo resist by varying the intensity of exposure with neutral density filters.

5. The process of claim 4 and wherein said exposure of said photo resist includes the step varying at a constant rate the aperture through which said light source exposes said photo resist.

6. The invention of claim 3 and where said exposure of said photo resist includes the step of varying the time to which said photo resist is exposed to said beam by varying the speed at which photo resist is drawn across said beam.

7. A method of measuring the response of photo resist to high pressure mercury arc lamp exposure comprising the steps of; providing at least one high pressure mercury arc lamp; utilizing discrete frequency bands from said high pressure mercury arc lamps to expose at the focus of said mercury arc lamps said photo resist; varying at a constant rate the exposure for each band to generate on said photo resist exposure lines; measuring the length of said exposure lines to determine their ratio of exposure one to another; placing a light meter at the focus of the apparatus; and for each discrete frequency calibrating said light meter to emit a signal in a weighted average proportional to the ratios whereby said light meter is tuned to the spectral response of said photo resist.

8. The invention of claim 3 and including the additional step of placing said spectrally tuned light meter in the path of a said first high pressure mercury arc lamp and utilizing the output of said light meter to determine exposure of said photo resist.

9. The invention of claim 7 and including the step of placing said light meter in a second light path from a second high pressure mercury arc lamp and utilizing the reading of said light meter to set the exposure of a second mercury arc lamp on photo resist.

10. The invention of claim 7 and wherein said ratio of said exposure lines is determined by measuring the lengths of said lines.

11. The invention of claim 7 and wherein said lines are placed on photo resist in the form of bar graphs.

12. In the process of setting the exposure time of photo resist to a high pressure mercury arc lamp including the steps of measuring the response of photo resist to exposures; setting the exposure time of said photo resist to produce an image and developing the photo resist to obtain an image the improvement in said measuring the light intensity of the exposure source on said photo resist of utilizing discrete frequency bands from said high pressure mercury arc lamp to expose at the focus of said mercury arc lamp said photo resist; varying at a constant rate for each band the exposure on said photo resist to generate exposure lines; measuring the exposure lines to determine their ratio of exposure one to another; placing a light meter at the focus of the apparatus; and for each discrete frequency calibrating said light meter to emit a signal in a weighted average proportional to said ratios; placing said light meter at the focus of said light source whereby said light meter receives light intensity in the same manner as said photo resist is exposed.

* * * * *